US007684265B2

(12) United States Patent
Bankman et al.

(10) Patent No.: US 7,684,265 B2
(45) Date of Patent: Mar. 23, 2010

(54) REDUNDANT CROSS POINT SWITCHING SYSTEM AND METHOD

(75) Inventors: Jesse R. Bankman, Gibsonville, NC (US); Kimo Y. F. Tam, Lincoln, MA (US)

(73) Assignee: Analog Devices, Inc., Norwood, MA (US)

( * ) Notice: Subject to any disclaimer, the term of this patent is extended or adjusted under 35 U.S.C. 154(b) by 32 days.

(21) Appl. No.: 11/711,243

(22) Filed: Feb. 27, 2007

(65) Prior Publication Data

US 2008/0205171 A1 Aug. 28, 2008

(51) Int. Cl.
*G11C 29/00* (2006.01)
(52) U.S. Cl. .................. 365/200; 365/201; 365/185.09; 714/7; 714/8; 714/718; 714/723; 714/725; 370/244; 370/250
(58) Field of Classification Search .................. 365/200, 365/201, 185.09; 714/7, 8, 723, 718, 725; 370/244, 250
See application file for complete search history.

(56) References Cited

U.S. PATENT DOCUMENTS

| 4,605,928 | A | * | 8/1986 | Georgiou | ................... | 340/2.25 |
| 5,805,614 | A | * | 9/1998 | Norris | ........................ | 714/776 |
| 6,459,648 | B1 | * | 10/2002 | Hogan et al. | ........... | 365/230.06 |
| 6,914,878 | B1 | * | 7/2005 | Lindblom et al. | ............ | 370/219 |
| 2004/0004856 | A1 | * | 1/2004 | Sakimura et al. | ............ | 365/158 |
| 2006/0028864 | A1 | * | 2/2006 | Rinerson et al. | ............ | 365/158 |

OTHER PUBLICATIONS

Jan M. Rabaey, "Digital Integrated Circuits, A Design Perspective", 1996, *Designing Memory and Array Structures*, Prentice Hall Electronics and VLSI Series, Chapter 10, pp. 551-628.
Randy H. Katz, "Contemporary Logic Design", Copyright 1994 The Benjamin/Cummings Publishing Company, Inc., *Sequential Logic Case Studies*, Chapter 7, pp. 330-333.
Meyer, Fred J. and Park, Nohpill, "*Predicting the Yield Efficacy of a Defect-Tolerant Embedded Core*," 2000 IEEE, ISBN 0-7695-0719-0/00 pp. 30-38.
Kabacinski, Wojciech and Lea, Chin-Tau and Xue, Guoliang, "*Guest Editorial: 50th Anniversary of Clos Networks*", http://www.comsoc.org/livepubs/cil/public/2003/oct/ciguest_kabacinski.html, vol. 41, No. 10, Oct. 2003.
Kabacinski, Wojciech and Lea, Chin-Tau and Xue, Guoliang, "*50th Anniversary of Clos Networks*", http://www.comsoc.org/cil/public/2003/oct/current.html, vol. 41, No. 10, Oct. 2003.

* cited by examiner

*Primary Examiner*—VanThu Nguyen
*Assistant Examiner*—Eric Wendler
(74) *Attorney, Agent, or Firm*—Goodwin Procter LLP

(57) ABSTRACT

A redundant cross point switching is achieved by mapping a redundant column/row of point cells and enabling at least one of the switching devices which is associated with each column/row to define an alternate path around the defective point cell which replicates the function of the switching location of the defective point cell.

10 Claims, 3 Drawing Sheets

REDUNDANT CROSS POINT SWITCHING SYSTEM AND METHOD

FIELD OF THE INVENTION

This invention relates to a redundant cross point switching system and method and more particularly to such a system and method which provides an alternate path around a defective point cell which replicates the function of the switching location of the defective point cell.

BACKGROUND OF THE INVENTION

New chip designs already exceed two million devices. The greater the number of devices on a chip the greater the possibility that one or more will fail. This would result in a lower yield driving up the cost of the chips. Redundancy techniques are designed to address this problem. Redundancy techniques are routinely used in large memories to lend a degree of defect tolerance and increase yield. In one approach one or more banks of extra memory are provided so that if one or more banks test as defective, the entire bank can be replaced by an extra one thereby saving the chip and increasing yield. However, in memory design the input and output can be the same. Every bank is accessible to the input and output data. The physical location of each memory cell is not position sensitive: it only need be susceptible to storage and retrieval.

In contrast in cross point switching systems there is position sensitivity: the cross point cell location is dictated by the connection it serves to make. This makes difficult redundancy design for replacing defective point cells in cross point switching systems. Nevertheless one approach that apparently has been used to increase yield is to package a number of cross point switch die in a single package making a single larger cross point switch with a higher yield. But this has shortcomings including: the higher power dissipated in intra-die I/O cells; higher path-dependent skew as a result of some connections needing to span the intra-die space; the need to test multiple die to construct a single large cross point switching system; and the need to discard a relatively large piece of silicon if one of these smaller cross point switches proves non-functional. The efficiency of redundancy in achieving improved yield in cross point switching cores is illustrated in the chart below.

CHART I

| Do [def/cm^2] Redundancy | 2 Yld (core) | 1.2 Yld (core) |
|---|---|---|
| 0 | 38% | 56% |
| 1 | 75% | 89% |
| 2 | 93% | 98% |

BRIEF SUMMARY OF THE INVENTION

It is therefore an object of this invention to provide an improved redundant cross point switching system and method.

It is a further object of this invention to provide such an improved redundant cross point switching system and method which enables large cross point arrays to be made economically.

It is a further object of this invention to provide such an improved redundant cross point switching system and method which improves yield for any given array size and process defect density.

It is a further object of this invention to provide such an improved redundant cross point switching system and method which provides around defects a redundant path which has similar characteristics, e.g., delay, jitter, rise time.

It is a further object of this invention to provide such an improved redundant cross point switching system and method which requires little extra area and no additional power.

It is a further object of this invention to provide such an improved redundant cross point switching system and method which can repair/replace any one or more column or row in the cross point array.

It is a further object of this invention to provide such an improved redundant cross point switching system and method which can repair/replace point cells as well as line (input and output buses and buffers) defects.

The invention results from the realization that a redundant cross point switching system and method can be achieved by mapping a redundant column/row of point cells and enabling at least one of the switching devices which is associated with each column/row to define an alternate path around the defective point cell which replicates the function of the switching location of the defective point cell.

The subject invention, however, in other embodiments, need not achieve all these objectives and the claims hereof should not be limited to structures or methods capable of achieving these objectives.

This invention features a redundant cross point switching system including an array of switching point cells arranged in row and columns; each point cell has a defined switching location in the array. There is at least one redundant column/row or point cell for replacing one or more defective point cells. A switching device is associated with each column/row. A control circuit is responsive to one or more defective point cell for mapping the redundant column/row of point cells and enabling at least one of the switching devices to define an alternate path around the defective point cell which replicates the function of the switching location of the defective point cell.

In a preferred embodiment the control circuit may map the redundant column/row to the column/row containing a defective point cell and may remap to the redundant column/row the switching device associated with the column/row containing a defective point cell for replacing that column/row with the redundant column/row. The control circuit may enable in a redundant column/row the point cell corresponding to the row/column containing a defective point cell and selectively re-map the switching devices from their associated column/rows to the redundant column/row for replacing the row/column containing the defective point cell. The original path through the defective point cell and replacement path through the redundant column/row may have substantially similar electrical components with similar electrical characteristics. One of the rows and columns may be the input the other the output.

The invention also features a redundant cross point switching method including providing an array of switching point cells arranged in rows and columns; each point cell having a defined switching location in the array. At least one redundant column/row of point cells is provided for replacing one or more defective point cells. A switching device is provided associated with each column/row. In response to one or more defective point cells, the redundant column/row or point cells is mapped and at least one of the switching devices is enabled to define an alternate path around the defective point cell which replicates the function of the switching location of the defective point cell.

In a preferred embodiment the redundant column/row may be mapped to the column/row containing a defective point cell and the switching device associated with the column/row containing the defective point cell may be remapped to the redundant column/row for replacing that column/row with the redundant column/row. The point cell in the redundant column/row corresponding to the row/column containing a defective point cell may be enabled and the switching devices may be selectively remapped from their associated column/rows to the redundant column/row for replacing the row/column containing the defective point cell. The original path through the defective point cell and the replacement path through the redundant column/row may have substantially similar electrical components with similar electrical characteristics. One of the row and column may be the input and the other the output.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
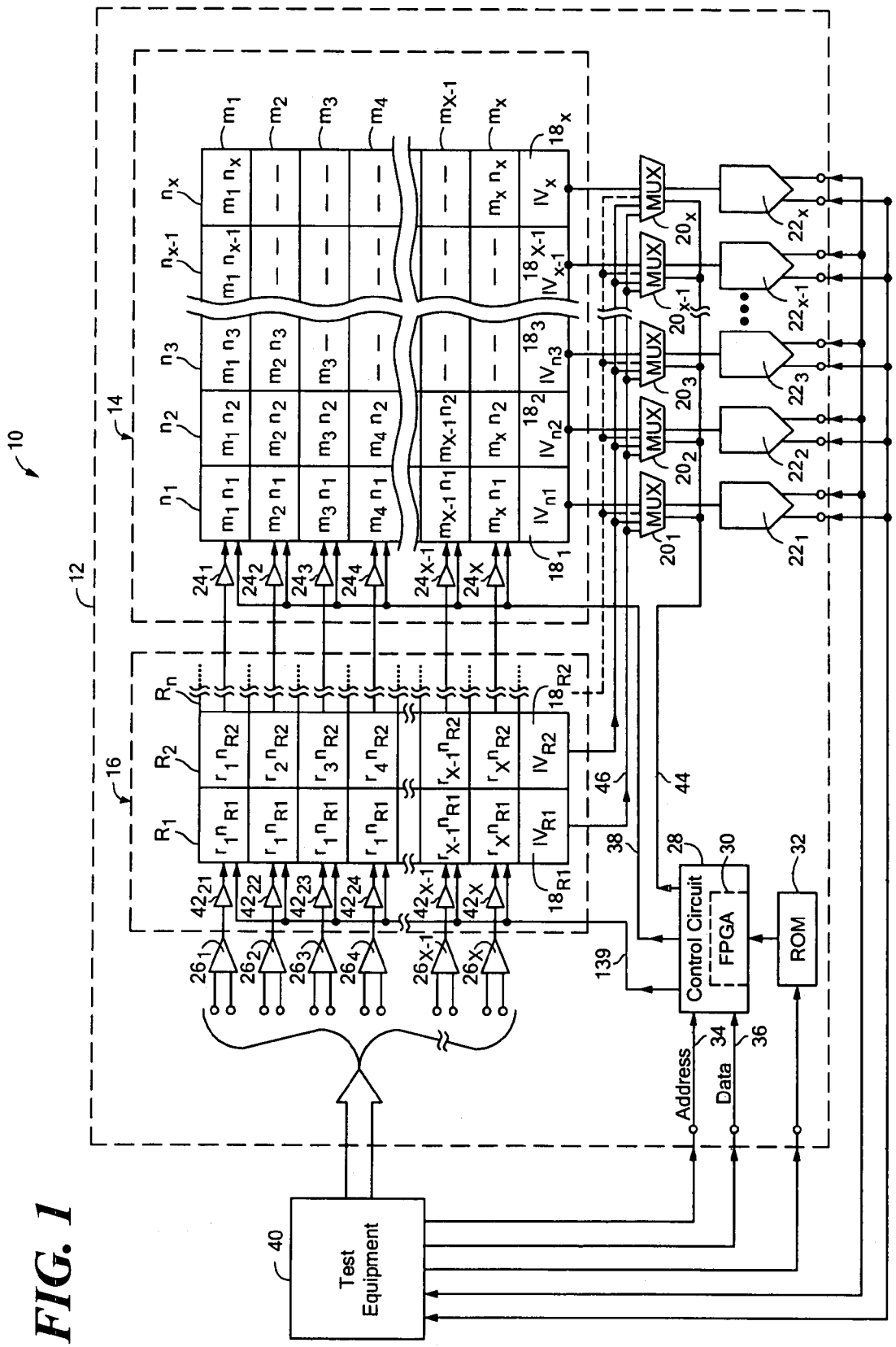
FIG. 1 is a schematic diagram of a redundant cross point switching system according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a redundant cross point switching system 10 according to this invention carried on a chip 12. Switching system 10 is designed to connect any one of a number of inputs m to any one of a number of outputs n and includes a switching core 14 and redundant column unit 16. Switching core 14 includes a plurality of point cells arranged in a number of columns $n_1$, $n_2$ $n_3$, $n_{x-1}$, $n_x$ and rows $m_1$, $m_2$, $m_3$, $m_4$, $m_{x-1}$, $m_x$. Each point cell is referenced by the intersection of the row and column that it represents: they are named $m_1$ $n_1$-$m_x$ $n_x$. Each of these point cells switches $m_1$ $n_1$-$m_x$ $n_x$ represents a unique switching position defined by its place in the array. While the array is shown to be made up of rows and columns in a perpendicular array, this is not a necessary limitation of the invention. Any geometry that allows the intersection for the unique definition of the positions is usable. Furthermore although the switching core has the same number of rows and columns in the figure this too is not a necessary limitation of the invention. Also the functions of the rows and columns are interchangeable.

At the bottom of each column, $n_1$-$n_x$ is a current to voltage converter circuit $18_1$, $18_2$, $18_3$, $18_{x-1}$, $18_x$ which converts to a voltage any output currents from the switch points in its column. Each column $n_1$-$n_x$ through its current to voltage converters $18_1$-$18_x$ provides an output to a switching device such as mux $20_1$-$20_x$; the output of each mux is delivered to output buffers $22_1$-$22_x$. Switching core 14 also includes an internal input buffer $24_1$-$24_x$. Primary input buffers $26_1$-$26_x$ receive the input signals which are delivered to and distributed by the switching action of switch core 14. Also included is control circuit 28 which includes a field programmable gate array 30 and ROM 32. While throughout only a limited number of components have been shown in keeping with the $m_1$-$m_x$, $n_1$-$n_x$ pictured array, this is not a necessary limitation of the invention as any number of switches, columns and rows may be implemented.

In operation assuming that none of the point cell switches $m_1$ $n_1$, $m_x$-$n_x$ are defective any input signal on input buffers $26_1$-$26_x$, can be delivered to any one of the output buffers $22_1$-$22_x$. For example, the address input 34 to control circuit 28 identifies the output slot or output buffer $22_1$-$22_x$ which is to receive the input signal. The data input 36 identifies the particular one of the cross point switches, $m_1$ $n_1$-$m_x$ $n_x$ which is to be actuated to effect that transfer.

For example, if an input at input buffer $26_1$ is to be delivered to output buffer $22_2$ control circuit 28 will send a signal on control line 38 to actuate point cell $m_1$ $n_2$ and to connect the output from column $n_2$ through mux $20_2$ to output buffer $22_2$. Or if the input signal on input buffer $26_3$ was to be delivered to output buffer $22_1$ the control signal on 38 would activate point cell switch $m_3$ $n_1$ and enable mux $20_1$ to provide the output of column $n_1$ to output buffer $22_1$.

However, as can be surmised often one or more of the point cells $m_1$ n-$m_x$ $n_x$ may be defective. To determine whether and which ones may be defective test equipment 40 is typically used to provide input signals to input buffers $26_1$-$26_x$ and sensing the outputs from output buffers $22_1$ to $22_x$ while providing addresses on line 34 and data on line 36 to cause the core switch 14 to be cycled through a test of every one of the point cell switches $m_1$ $n_1$-$m_x$ $n_x$.

In accordance with this invention a defect can be cured using the redundant column unit 16 which includes one or more redundant columns $R_1$, $R_2$, $R_n$ of point cell switches. Column $R_1$ includes point cells $r_1$ $n_{R1}$-$r_x$ $n_{R1}$. Column $R_2$ includes point cells $r_1$ $n_{R2}$-$r_x$ $n_{R2}$, each column $R_1$, $R_2$ also includes a current to voltage converter $18_{R1}$ $18_{R2}$. Redundant column unit 16 also includes internal input buffers $42_1$, $42_2$, $42_3$, $42_4$, $42_{x-1}$, $42_x$.

Assuming, then, that during testing a point cell in switch core 14 has been found to be defective, for example, point cell $m_2$ $n_2$. Test equipment 40 stores this fact in ROM 32 which enables field programmable gate array (FPGA) 30 to provide the signal on line 44 to mux $20_2$ to disable it from its connection with column $n_2$ and instead to connect it via line 46 to redundant column $R_1$. Control line 39 enables auxiliary point cell $r_2$ $n_{R1}$ and its associated input buffer $42_2$. At the same time FPGA is now programmed to operate point cell $r_2$ $n_{R1}$ in column $R_1$ whenever a point cell in column $n_2$ is identified and the output of column $R_1$ is then delivered to mux $20_2$ in place of the output from column $n_2$ which normally would have been delivered there. By this remapping a defect in any one of the columns $n_1$-$n_x$ can be replaced using redundant column $R_1$ or in a second one of the columns $n_1$-$n_x$ using redundant column $R_2$ and so on through redundant column $R_n$. Note, however, that while there is significant improvement, as shown in Chart 1 in the Background for one redundancy and even two redundancies, the cost benefit decreases as more are added. Eventually, of course, there could be as many redundant columns as there are originals but this of course would not effect the desired cost benefit and yield goals.

Alternatively, a redundant column $R_1$, $R_2$, $R_n$, can be used to replace an entire row as opposed to a column. For example, assume that there are two defects in the same row: point cell $m_3$ $n_1$, and point cell $m_3$ $n_2$ are defective in row $m_3$. In that case, with those defects recorded in ROM 32 by test equipment 40, field programmable gate array 30 turns on point cell $r_3$ $n_{R1}$ in redundant column $R_1$. Then anytime an input signal is directed to row $m_3$ the signal instead travels through point cell $r_3$ $n_{R1}$ to line 46 and field programmable gate array 30 acting over line 44 will connect the proper one of muxes $20_1$-$20_x$ to line 46. But when $m_3$ is not been addressed the muxes $20_1$-$20_x$ operate as usual with their primary connection to their associated column $m_1$-$n_x$. For example, assuming again that row $m_3$ is to be circumvented at $r_3$ $n_{R1}$ and destined for output buffer $22_2$. In that case field programmable gate array 30 over line 44 connects mux $20_2$ to the output from column $R_1$. If the input signal was to go to $m_3$ $n_1$ then mux $20_1$ would be connected to the output 46 from column $R_1$. Otherwise muxes $20_1$-$20_x$ remain connected to their normally associated outputs from columns $n_1$-$n_x$.

In this way by remapping the switching devices, muxes $20_1$-$20_x$ and a redundant column, e.g. $R_1$, an alternate path around a defective point or points can be configured to save the chip 12 and increase yield with only a small increase in the circuitry and area required by the addition of one, two or possibly more redundant columns. While the switching devices $20_1$-$20_x$ are shown as muxes this is not a necessary limitation of the invention, as for example, they may be simply one more set of point cells in switch core 14 to perform the switching.

One of the advantages of this invention is that the replacement path using the redundant column has substantially similar electrical components and conductors with similar electrical characteristics. That is, whether replacing a row or a column in switch core 14 the redundant or alternate path will always include an internal buffer amplifier $42_1$-$42_x$ or an internal buffer $24_1$-$24_x$ and a current to voltage circuit $18_{R1}$, $18_{R2}$, or $18_1$-$18_x$. That is, there will be an internal buffer from one group or the other and a current to voltage converter from one group or the other in the replacement path which mimics closely those components associated with the point cells in the original switch core 14: they are made by the same process and on the same chip.

This invention also includes the method of redundant cross point switching which maps a redundant column of point cells and enables at least one of the switching devices to define an alternate path around the defective point cell which replicates the function of the switching location of the defective point cell. For column replacement the redundant column is mapped to the column containing a defective point cell and the switching device associated with the column containing the defective point cell is remapped to the redundant column for replacing that column with the redundant column. For row replacement the point cell in the redundant column corresponding to the row containing a defective point cell is enabled and the switching devices are selectively remapped from their associated columns to the redundant column for replacing the row containing the defective point cell. The original path through the defective point cell and the replacement path through the redundant column have substantially similar electrical components with similar electrical characteristics. One of the row and columns may be the input and the other the output.

The cross point switching system 10, FIG. 1, is configured to connect an output to an input by enabling a point cell at an appropriate location in the switching core. An enabled point cell ideally provides a unidirectional, buffered signal flow from input to output as already described. A disabled point-cell is equivalent to no signal flow between the input and output with which that point-cell is associated.

Figure 2:
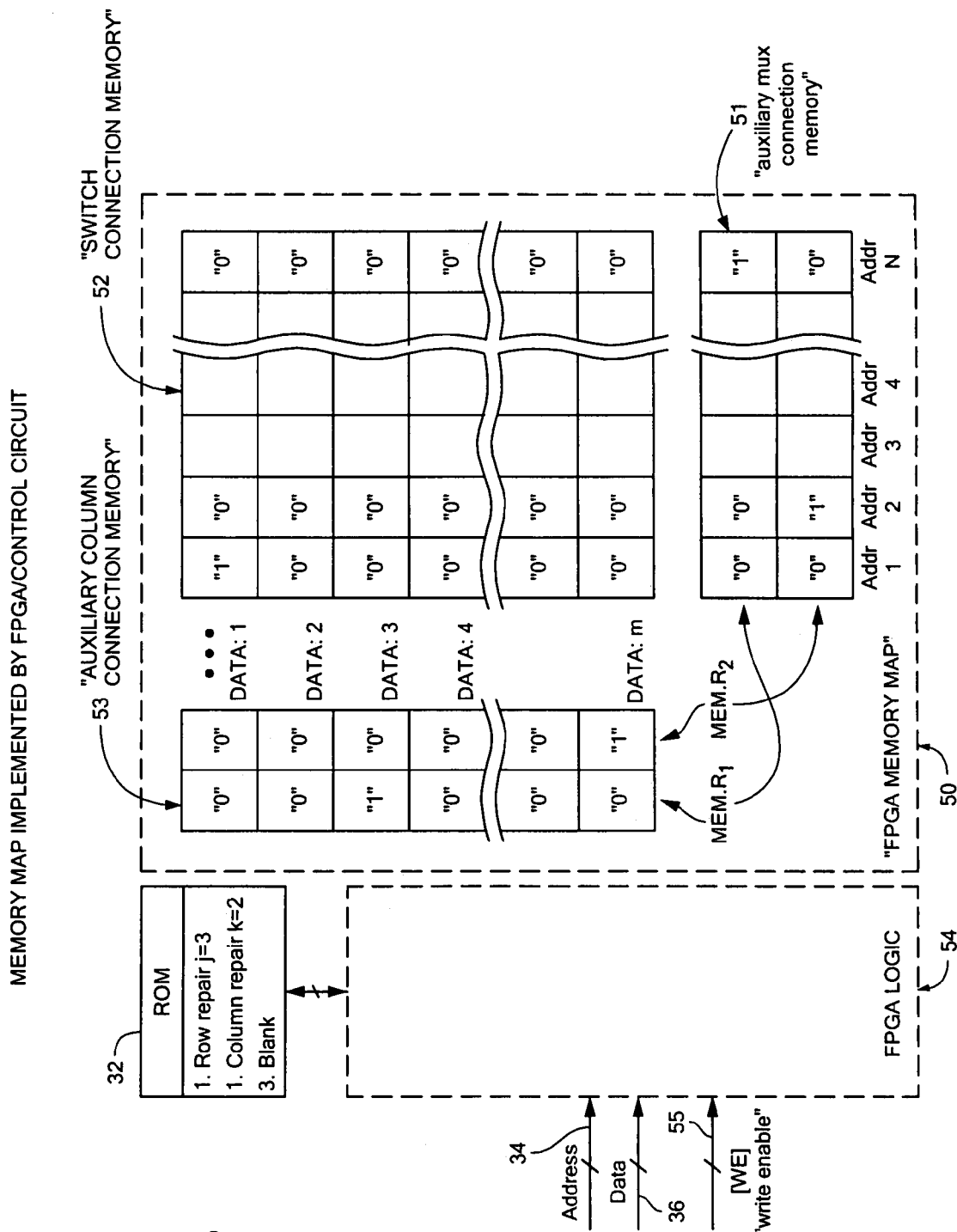
FIG. 2 is an illustration of a memory map implemented in FPGA, ROM and control circuit of FIG. 1.

The point cell enablement and disablement is accomplished by control circuit 28, and FPGA 30. FIG. 2 describes the control and memory structure, while FIG. 3 describes the logic governing the programming of the memory in FIG. 2.

The FPGA/control circuit 28, 30 implements a memory or memory/50, FIG. 2, and control logic 54. The memory maps or records and controls the state, enabled or disabled, of every point-cell, auxiliary-point, $r_1$, $n_{R1}$-$r_x$, $n_{R1}$, $r_1$ $n_{R2}$-$r_2$ $n_{R2}$ and auxiliary mux $20_1$-$20_s$ in the cross-point system. One implementation of such a mapping memory 50 uses a single bit, (state='1' or '0'), to record the state of each point-cell, auxiliary point, and auxiliary mux. In as much as the function of a point-cell is to create or prevent a connection between a specified output and a specified input, controlling point-cell state and specifying output-to-input connectivity, are equivalent. Since the cross point switching system 10 allows a given output to connect to at most a single input, at most a single point cell in any column will be enabled. There are a multitude of ways to encode this "one-of-n" code, including a single binary word per column. The encoding one uses for the memory mapping is a trade-off between wire-area, memory-area, and decoder area; the optimum answer being dependent on the details of the particular process technology and design details of the cross point core.

A cross point switching system without redundant paths would implement switch connection memory 52 only. The system with redundancy uses an auxiliary column connection memory 53 and an auxiliary mux connection memory 51 to control the state of the points in the replacement columns $R_1$, $R_2$, —$R_n$ and the input selection of the auxiliary muxes, $20_1$-$20_x$, respectively. The implementation of memory circuits, register files, and memory mapping structures are well-understood and described in the literature. Rabaey, Jan M. "Digital Integrated Circuits, a design perspective," Chapter 10, Designing Memory and Array Structures. Prentice Hall, 1996, Upper Saddle River, N.J., 07458. Pp 551-628. Katz, Randy H. "Contemporary Logic Design," Register File. The Benjamin/Cummings Publishing Company, Inc, 1994. Pg 331. Word and column decoders are understood to be present and a matter of implementation. Control outputs on lines 38 and 44 actuate the point-cells of structures 16 and 14 and the input select bits of structures $20_1$-$20_x$.

Figure 3:
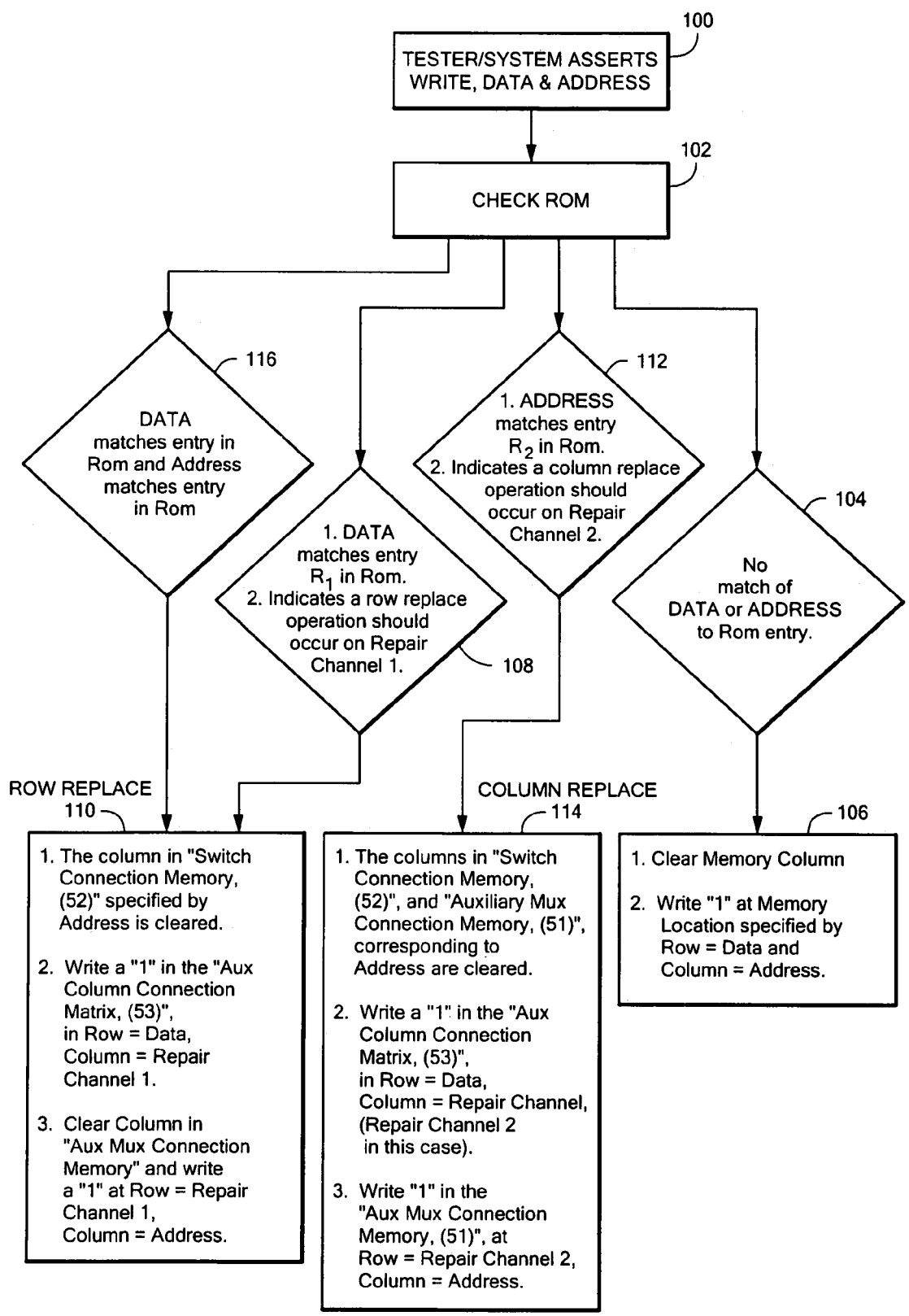
FIG. 3 is a flow chart/logic block diagram illustrating the operation of the method using the control circuit, FPGA and ROM of FIG. 1.

During cross point output-to-input connection programming, the FPGA 54 logic functions as follows referring to FIGS. 2 and 3. The external system or test equipment 40 in step 100 asserts codes on the Address, Data, and Control inputs 55 to read or write to the memory map, thereby specifying the desired matrix connections between outputs and inputs. In the described implementation, the value of the address bus corresponds to output N, the value of the data bus corresponds to the input M that output N should connect to, and the control strobe Write Enable, (WE), instructs the FPGA logic to write-to the specified location in memory.

In step 102 the FPGA logic 54 checks the ROM 32 to see if the Address or Data bus codes correspond to a column (output) or row (inputs that has been repaired. If no repair operation is indicated in case 104 by the ROM, then in step 100 the bit-columns in the "Switch Connection Memory," 52 and the "Auxiliary Mux Connection Memory" 51 indicated by the code on the address bus are cleared, (all zeros written), except for the memory-bit at the intersection of this column and the row indicated by the code on the data bus, to which a "1" is written.

If the code on the data-bus matches a code stored in the ROM, case 108, indicating a repaired row, then in step 110 the index of the matching ROM code indicates Repair Path X should be used; (e.g. if the first entry in the ROM generates the match, then the column in 53 and the row in 51 corresponding to "Repair Path 1" are addressed). The bit-columns in the "Switch Connection Memory" 52 and the "Auxiliary Mux Connection Memory" 51 indicated by the code on the address bus are cleared, (all zeros written), except for the memory-bit in 51 at location Row=Repair Path X, Column=Address, to which a "1" is written. The bit-column in the "Auxiliary Column Connection Memory," 53 corresponding to the Repair Path indicated by the ROM is cleared, except for the memory-bit in the row indicated by the code on the data bus, which is set to "1". If the code on the address-bus matches a code stored in the ROM, case 112, indicating a repaired column, then in step 114 the index of the matching ROM code indicates which repair path to use as described above. The bit-columns in the "Switch Connection Memory," 52 and the "Auxiliary Mux Connection Memory" 51 indicated by the code on the address bus are cleared, (all zeros written), except for the memory-bit in 51 at location Row=Repair Path X, Column=Address, which is set to "1". The bit-column in the "Auxiliary Column Connection Memory," 53 corresponding to the Repair Path indicated by the ROM is cleared, except for the memory-bit in the row indicated by the code on the data bus, which is set to "1". If cases 108 and 112, that is, case 116, both occur for codes on address and data, only step 110 is implemented.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A redundant cross point switching system comprising:
an array of switching point cells arranged in rows and columns, each point cell having a defined switching location in its array;
at least one redundant column/row of point cells for replacing one or more defective point cells;
at least one switching device, each switching device in electrical communication with one column/row of the array and at least one redundant column/row of point cells; and
a control circuit responsive to one or more defective point cells for causing at least one of said switching devices to utilize the redundant column/row of point cells instead of the one or more defective point cells to define an alternate path around the defective point cell which replicates the function of the switching location of the defective point cell.

2. The redundant cross point switching system of claim 1 in which said control circuit maps said redundant column/row to the column/row containing a defective point cell and remaps to said redundant column/row the switching device associated with the column/row containing the defective point cell for replacing that column/row with the redundant column/row.

3. The redundant cross point switching system of claim 1 in which said control circuit enables in said redundant column/row the point cell corresponding to the row/column containing a defective point cell and selectively remaps said switching devices from their associated said column/rows to said redundant column/row for replacing the row/column containing the defective point cell.

4. The redundant cross point switching system of claim 1 in which the original path through the defective point cell and the replacement path through the redundant column/row have substantially similar electrical components with similar electrical characteristics.

5. The redundant cross point switching system of claim 1 in which one of said rows and columns may be the input and the other the output.

6. A redundant cross point switching method comprising:
providing an array of switching point cells arranged in rows and columns; each point cell having a defined switching location in its array;
providing at least one redundant column/row of point cells for replacing one or more defective point cells;
providing at least one switching device, each switching device in electrical communication with one column/row of the array and at least one redundant column/row of point cells; and
in response to one or more defective point cells, causing at least one of said switching devices to utilize the redundant column/row of point cells instead of the one or more defective point cells to define an alternate path around the defective point cell which replicates the function of the switching location of the defective point cell.

7. The redundant cross point switching method of claim 6 in which said redundant column/row is mapped to the column/row containing a defective point cell and said switching device associated with the column/row containing the defective point cell is remapped to said redundant column/row for replacing that column/row with the redundant column/row.

8. The redundant cross point switching method of claim 6 in which the point cell in the redundant column/row corresponding to the row containing a defective point cell is enabled and said switching devices are selectively remapped from their associated said columns/rows to said redundant column/row for replacing the column/row containing the defective point cell.

9. The redundant cross point switching system of claim 6 in which the original path through the defective point cell and the replacement path through the redundant column/row have substantially similar electrical components with similar electrical characteristics.

10. The redundant cross point switching system of claim 6 in which one of said rows and columns may be the input and the other the output.

* * * * *